(12) United States Patent
Barber et al.

(10) Patent No.: US 6,890,445 B2
(45) Date of Patent: May 10, 2005

(54) PROCESS FOR PACKAGING ELECTRONIC DEVICES USING THIN BONDING REGIONS

(75) Inventors: Bradley Paul Barber, Chatham, NJ (US); LaRue Norman Dunkleberger, Kintnersville, PA (US); Jason Paul Goodelle, Bethlehem, PA (US); Thomas Herbert Shilling, Macungie, PA (US)

(73) Assignee: Agere Systems, Inc., Allentown, PA (US)

( * ) Notice: Subject to any disclaimer, the term of this patent is extended or adjusted under 35 U.S.C. 154(b) by 19 days.

(21) Appl. No.: 10/017,942

(22) Filed: Dec. 13, 2001

(65) Prior Publication Data

US 2003/0111437 A1 Jun. 19, 2003

(51) Int. Cl.[7] .............................................. H01L 21/302
(52) U.S. Cl. ............................ 216/2; 216/13; 216/17; 216/20; 216/33; 216/38; 216/52; 216/88; 438/106; 438/107; 438/125
(58) Field of Search ................................ 216/2, 11, 13, 216/17, 20, 33, 38, 52, 79, 88; 438/106, 107, 125

(56) References Cited

U.S. PATENT DOCUMENTS

| 4,622,574 | A | * | 11/1986 | Garcia ........................ 257/627 |
| 5,604,160 | A | * | 2/1997 | Warfield ...................... 438/113 |
| 5,891,751 | A | * | 4/1999 | Kurtz et al. .................. 438/53 |
| 6,062,461 | A | * | 5/2000 | Sparks et al. ............. 228/123.1 |
| 6,106,735 | A | * | 8/2000 | Kurle et al. .................... 216/2 |
| 6,323,744 | B1 | * | 11/2001 | Barber et al. ................ 333/189 |
| 6,400,440 | B1 | * | 6/2002 | Colgan et al. .............. 349/160 |
| 2002/0017862 | A1 | * | 2/2002 | Sasaki et al. ................ 313/582 |
| 2002/0096421 | A1 | * | 7/2002 | Cohn et al. .................. 200/181 |

FOREIGN PATENT DOCUMENTS

JP    2001035396 A * 2/2001 .......... H03K/19/00

* cited by examiner

*Primary Examiner*—Anita Alanko

(57) ABSTRACT

In the method, a cap wafer surface is lithographically etched at time of fabrication, so that a raised ridge onto which bonding material is placed is formed near a perimeter of a desired cavity region. This is done in order to reduce the bonding area between the cap wafer and electronic device wafers, so as to provide a better defined standoff. In another aspect of the method, the cap wager surface is lithographically etched to form recesses or trenches near the perimeter of a cavity region, each recess being filled with a sealing material, and polished if necessary to be flush with the cap wafer surface. Thereafter, the cap wafer surface is etched so that the filled recesses become the raised ridges which are used to bond a cap wafer to an electronic device wafer.

5 Claims, 4 Drawing Sheets

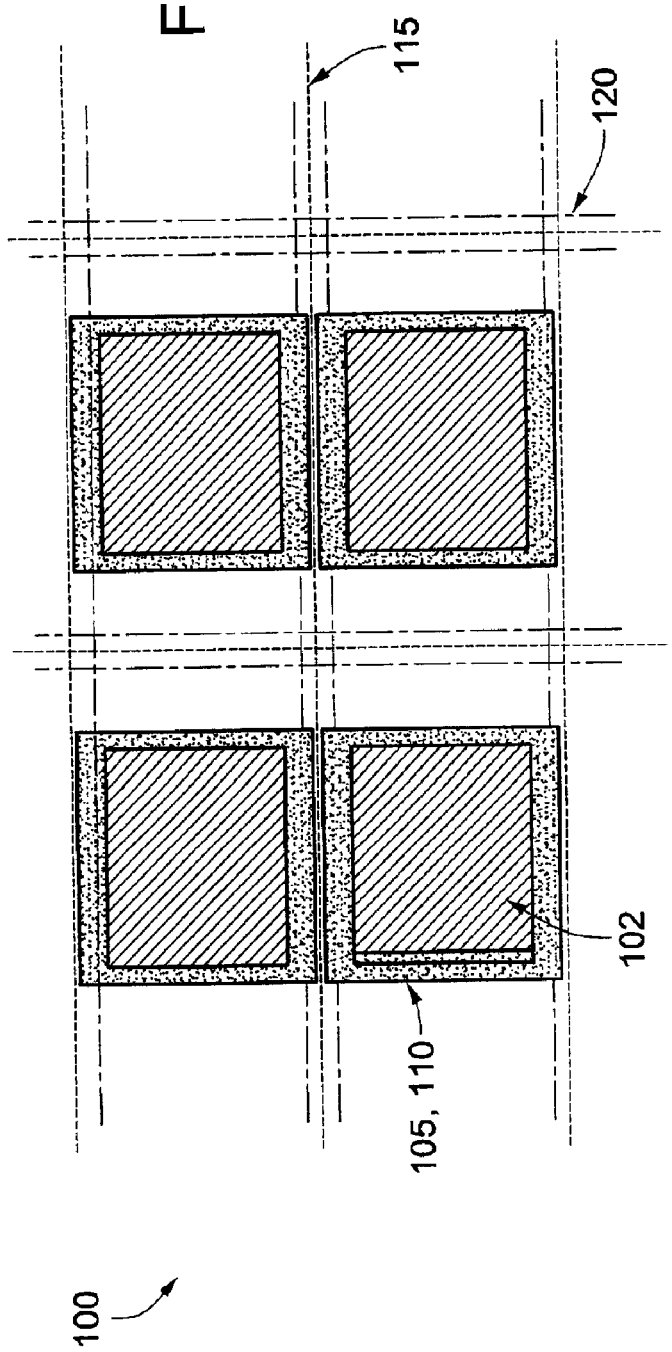
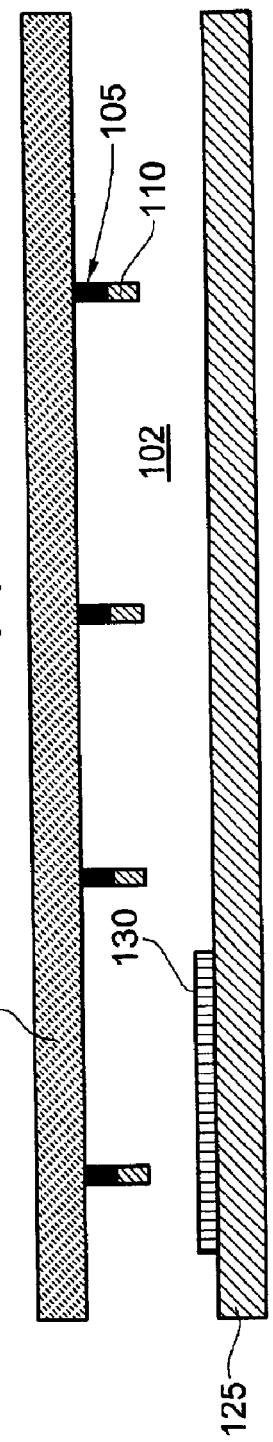
FIG. 1(a)
FIG. 1(b)

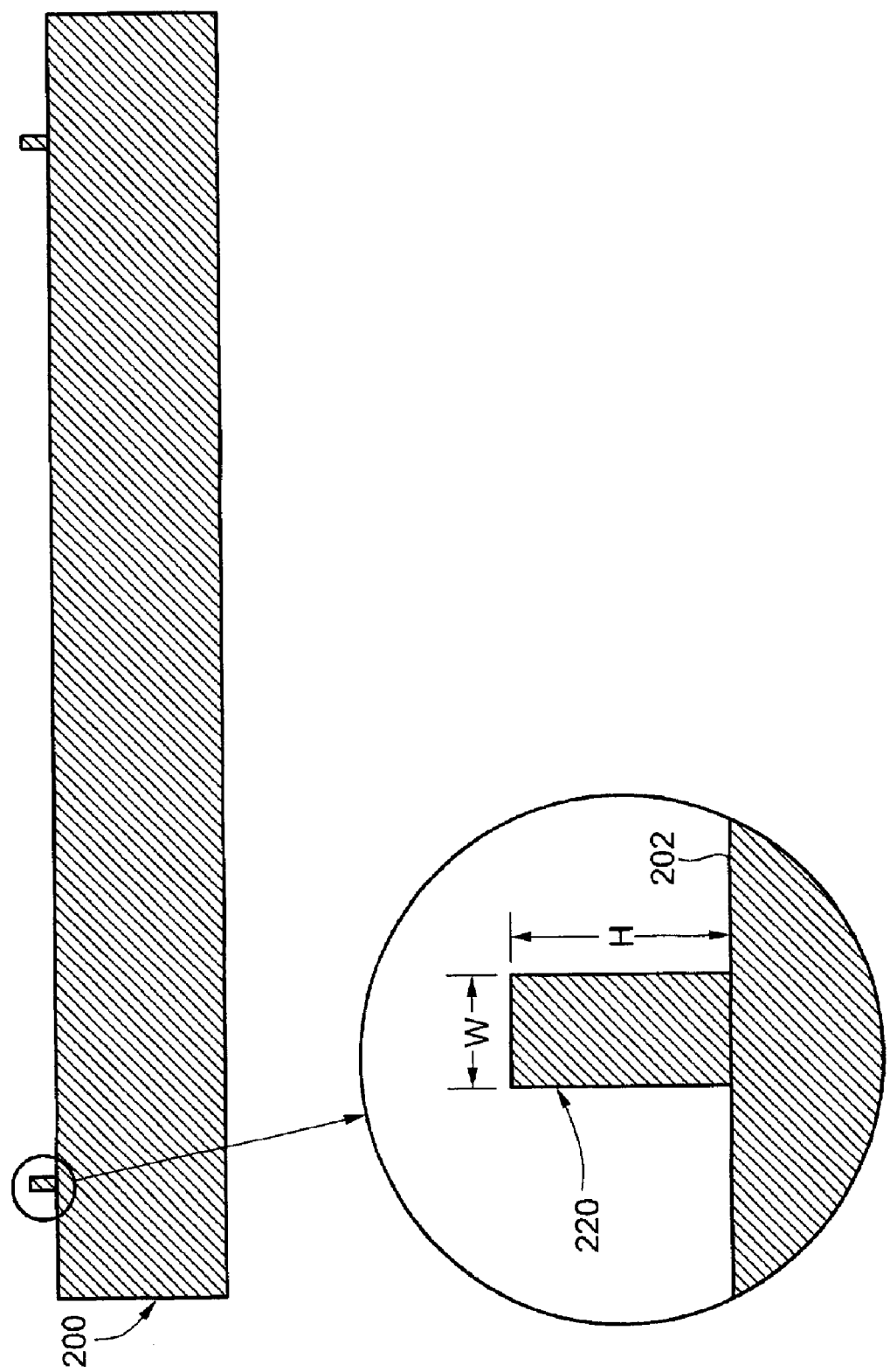

PROCESS FOR PACKAGING ELECTRONIC DEVICES USING THIN BONDING REGIONS

BACKGROUND OF THE INVENTION

1. Field of the Invention

The present invention generally relates to electronic devices and more particularly to a method for packaging devices using thin bonding regions.

2. Description of Related Art

Electronic devices fabricated in a large scale integrated (LSI) manner by thin film deposition, etching, etc., need to be packaged so as to be easily handled, and so as to be reliable in the variety of environmental conditions that are typically present in electronic systems. In the case of most simple electronic devices, polymer materials may be applied directly on the surface of a finished device for packaging. In the case of devices that are based on acoustic waves or mechanical motion, the part of the device that contains these acoustic waves must be isolated from intimate contact with packaging material, or the acoustic wave may be corrupted. The isolation can be achieved by forming a desired sized cavity of desired depth over the devices. It is preferred to form these cavities at the wafer scale, such that a multitude of devices are made in a batch process, lowering the cost per part. One way to do this is to prepare a capping wafer to be bonded to a wafer that is prepared with devices. These wafers can then be bonded together, and thereafter the devices can be singulated (e.g., separated into individual devices).

One such type of device is a thin film resonator (TFR). In these devices, electrical signals are transformed into acoustic waves in a piezoelectric material, the acoustic waves resonate in a prepared structure where certain frequencies are reinforced, and electrical signals are again produced by the now changed acoustic waves to produce a filtering function. For example, such a TFR is disclosed in U.S. Pat. No. 6,323,744 to Barber et al. entitled "GROUNDING OF TFR LADDER FILTERS", the entire contents of which are hereby incorporated herein by reference.

A conventional wafer stack is described in FIGS. 1–2 of U.S. Pat. No. 6,106,735 to Kurle et al, where a cap wafer 3 is fabricated with webs 4 and contact holes 9. These webs 4 are sealingly bonded to a substrate surface containing sensor components, such that gaps (caverns) are formed between adjacent webs.

Each of these webs have bonding strips 5 (e.g., frit glass seal strips) deposited on webs 4. These strips 5 are used for bonding the cap wafer 3 to a substrate wafer 1. In particular, these frit glass seal strips 5 have a line width 21 of about 500 micrometers, which corresponds to the header width of a particular web 4.

The frit strips shown in the prior art are typically applied with a screen printed process, and a resulting minimal linewidth is typically quite large, greater than 125 microns, as indicated in Kurle et al. This is undesirable, since these substrate surfaces (to which the cap wafer is to be attached to) contain many electrical components or sensors such as thin film resonator (TFR) components and/or filter components. From these components or devices, interconnects must be run under the frit seal in the cap wafer, and in the above example in Kurle et al., an additional 500 extra microns of "runner" are needed in order to get underneath the frit. This introduces resistive losses and additional inductive and capacitive parasitics that limit device performance.

Additionally, the excessive frit width of the prior art also introduces a significant increase in die size; thus there are fewer sensory devices produced per wafer.

SUMMARY OF THE INVENTION

To overcome the aforementioned problems, the present invention provides a method of packaging sensory devices such as RF components, where raised areas are formed on a cap wafer surface near the perimeter of a desired cavity region, such that the cap wafer surface may be bonded to a substrate surface containing RF sensor components. These raised areas can form an entire perimeter around the capping region if the cavity is desired to be sealed, and specific sealing material such as glass frit can be used, if an impervious or hermetic seal is desired.

In one aspect, the cap wafer surface is lithographically etched at time of fabrication, so that a raised ridge is formed near the perimeter of the desired cavity region. In another aspect, the cap wafer surface is lithographically etched to form recesses or trenches at the cavity perimeter, each recess being filled with a sealing material, and polished if necessary to be flush with the cap wafer surface. Thereafter, the cap wafer surface (except for the filled recesses) is etched so as to form the aforementioned raised ridges.

Etching can be used to remove material from a silicon capping wafer using fluorine-based chemistry XeF2 for example, which would not affect a glass-based frit material. The resultant cap wafer surface results in a finer frit line width, much narrower than what is currently achievable. Moreover, in either aspect the raised ridge feature can be made to any desired height and/or width so that the frit linewidth alone does not set the stand-off distance between the cap wafer surface and the substrate surface to which it is bonded.

BRIEF DESCRIPTION OF THE DRAWINGS

The present invention will become more fully understood from the detailed description given hereinbelow and the accompanying drawings, wherein like elements are represented by like reference numerals, which are given by way of illustration only and thus are not limitative of the present invention and wherein:

FIGS. 1(a) and 1(b) illustrate bottom and side views of a capping wafer and device wafer surface in accordance with the invention;

FIG. 2 illustrates an enlarged view of a raised ridge formed by the method in accordance with one embodiment of the invention;

DETAILED DESCRIPTION

Figure 3A:
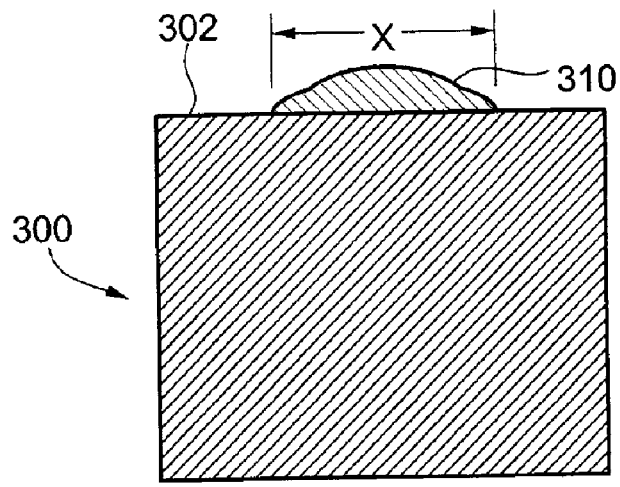
FIGS. 3(a) and 3(b) illustrate exemplary frit linewidth dimensions in accordance with the present invention.

FIGS. 1(a) and 1(b) illustrate bottom and side views of a section of a capping wafer in accordance with the invention. It is understood that this region can be repeated to fill the area of the capping wafer 100. As shown in FIG. 1(a), a desired cavity region 102, is defined by thin bonding strips or ridges 105 near the cavity's perimeter. As shown, the bonding strips or ridges 105 enclose the cavity region 102 entirely, but it may be desirable to only place bonding material partially around the perimeter of the cavity region 102.

A sealing material 110 is placed on top of the bonding strips (or ridges) 105. The sealing material 110 bonds cap 100 to an electronic device wafer 125 upon which sits electrical connection (runner) 130, as shown in FIG. 1(b). Preferably sealing material 110 is a glass frit which is screen printed on the cap wafer 100. Once the bonding strips 105 and sealing material 110 are formed, the cavity regions 102 thereby formed between cap wafer 100 and device wafer 130, are then singulated, or diced as is known in the art along a cut line 115. Preferably, these are cut with a diamond-tipped wet saw along saw streets 120. The saw streets 120 are defined by the dashed lines in FIG. 1(a) around a cut line 115, and similarly in the vertical direction. Saw streets 120 preferably are about 100 micrometers wide with the cut line 115 preferably about 30 micrometers wide.

FIG. 2 illustrates an enlarged view of a raised ridge formed by the method in accordance with one embodiment of the invention. In this cross-sectional view, and specifically as shown in the enlarged view, a raised ridge 220 is formed inboard from the edge of the desired cavity region 200. Both the height and width of the ridge 220 may be adjusted to any desired dimension during initial fabrication of the cap wafer surface 202.

This flexibility in adjusting height and width of ridge 220 encourages a different separation between the surface of a device wafer (not shown) and the cap wafer surface 202 than would be possible if the designer was strictly relying on the thickness of deposited sealing (frit) material. Also, if that height is also a critical parameter, a more reproducible standoff could be produced if the frit material is applied so as to be a small fraction of the total height, where a greater ridge definition is utilized as the majority of the total height of the ridge 220. Further, the position of the ridge 220 on the cap wafer surface 202 can also be adjusted during fabrication of the cap wafer 200.

Specifically, the raised ridges 220 may be lithographically formed by masking the surface and then performing an etching process during time of fabrication, as is known in the art. For example, if the capping wafer is silicon, photo-definable resist can be patterned in the shape of the ridges, and then fluorine-based etches can be used to remove material not masked by the resist. The resist can be removed after the etch, leaving the desired ridge pattern. These ridges 220 can then act as the bonding regions (or ridges) 105 onto which sealing material 110 is applied.

Figure 3B:
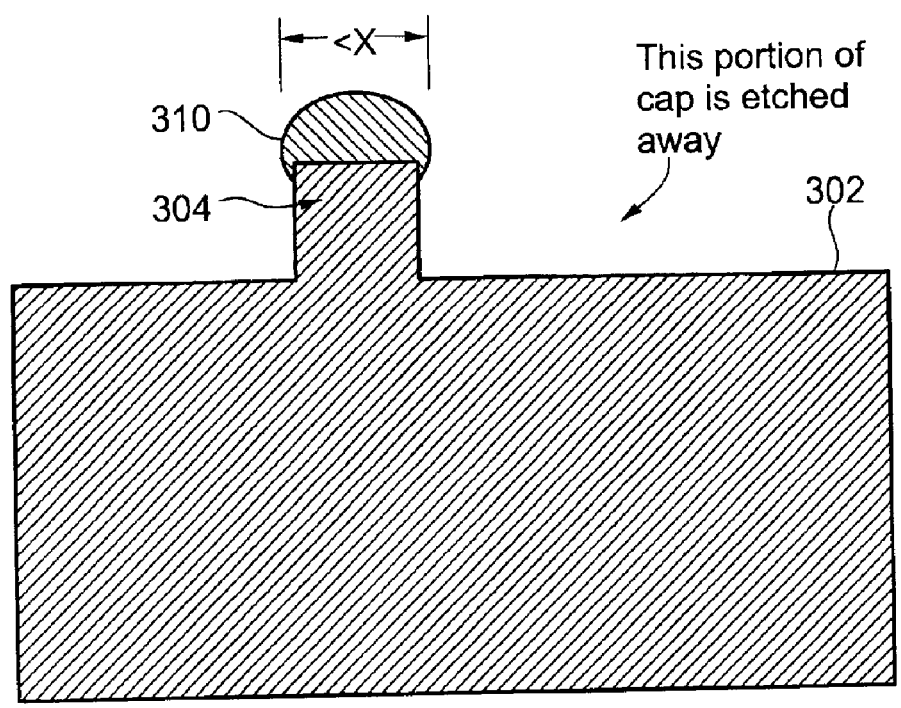

FIGS. 3(a) and 3(b) illustrate exemplary frit linewidth dimensions in accordance with the present invention. As shown in FIG. 3(a), on a surface of a conventional cap wafer 300, the glass frit 310 is merely deposited on the flat surface 302 and has a frit linewidth of X which may be undesirably greater than 125 microns due to screen printing limitations. Also, the frit linewidth of X may increase after frit deposition due to the lateral flow of the low-viscosity frit material. However, and as seen in FIG. 3(b), by providing a cap wafer surface 302 that has been etched so as to form raised ridges 304 onto which the sealing 310 is applied, the frit linewidth dimension is reduced to a value less than X(<X). Therefore the sealing material 310 that is printed on the raised ridge 304 is subject to a surface tension to "hold" the sealing material 310 into higher, thinner line dimensions.

Additionally, any excess material will flow off of the ridge 304. This is advantageous with respect to minimizing the frit linewidth (<X) and reducing capacitive parasitics, since not much of the surface area of the cap wafer surface 302 is in contact with the substrate surface and electrical components (not sown) attached thereto. Thus, shorter electrical runners (not shown in FIGS. 3(a) and 3(b) are needed, and therefore less of the runner is subjected to undesirable parasitics. These runners are required to go underneath the sealing material 310 to provide electrical signals to and from these components.

Figure 4A:
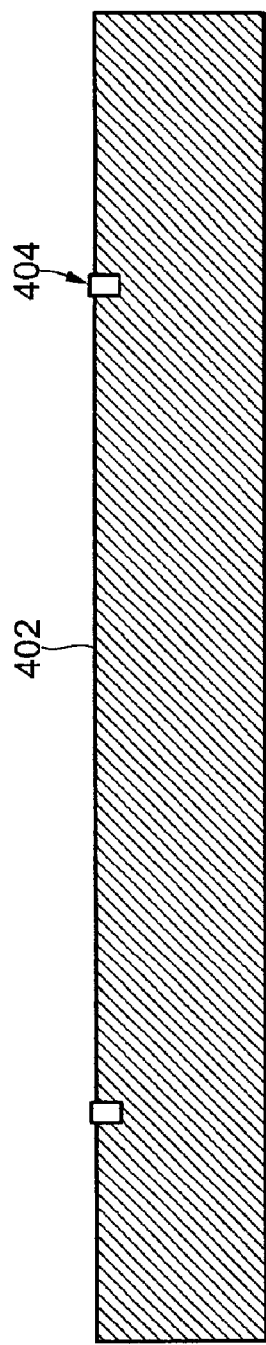
FIGS. 4(a)–4(c) illustrate the steps of forming a raised ridge in accordance with another embodiment with the present invention.
Figure 4B:
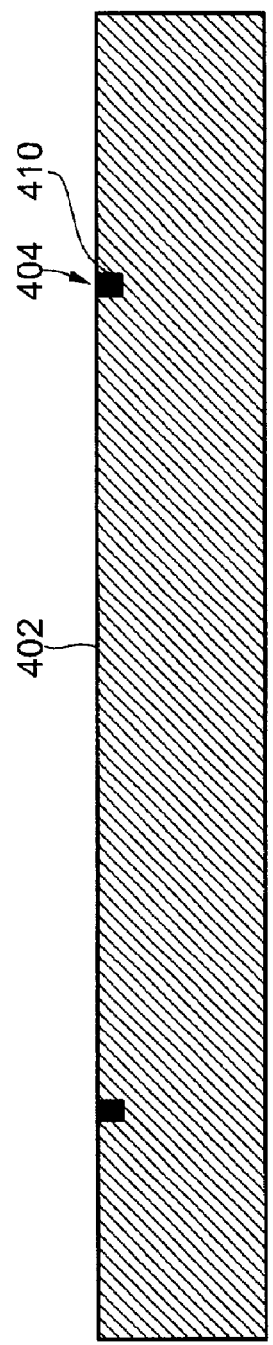
Figure 4C:
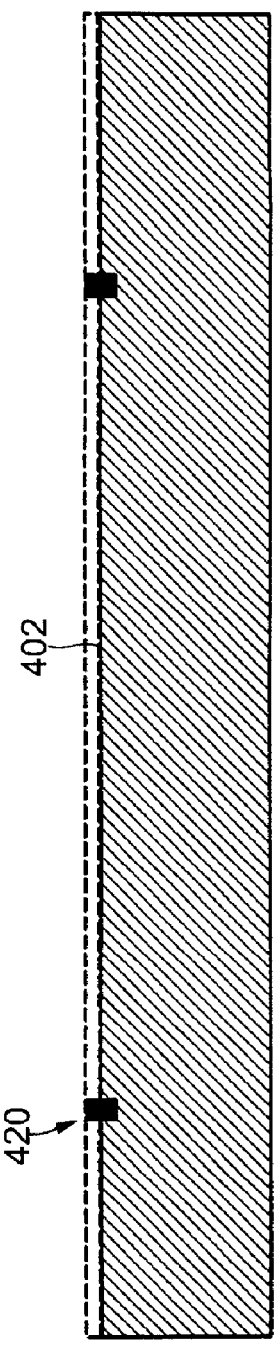

FIGS. 4(a)–4(c) illustrate process steps of forming a raised ridge 420 in a second embodiment of the present application. As shown in FIG. 4(a), initially a cap wafer surface 402 is trenched or etched in order to form recesses 404. These recesses 404 are preferably formed near the perimeter of the desired cavity region (containing the electrical devices to be capped) on cap wafer 400, as shown in FIG. 4(a).

In FIG. 4(b), sealing material 410 such as glass frit is printed into the recesses 404, and is made flush (i.e., planarized) with the surface 402 of the cap wafer 400, preferably by polishing if necessary. The frit could be applied everywhere on the capping wafer or just spanning the recessed regions as long as material is placed into the recesses. The frit material is then semi-cured to a solid state via a heating process. Thereafter in FIG. 4(c), the areas of the cap wafer surface 402 are selectively etched away (see dotted line), with the exception of the printed sealing material 410 at recesses 404, so as to form the desired raised ridges 420 at the ends of the cap wafer surface 402.

Using this trench fill process in accordance with the invention, after the trench is filled, surrounding wafer material may be etched away to a selected depth, leaving any desired standoff height, regardless of frit material height. For example, a low clearance cavity can be made if only a fraction of the recessed sealing material (glass frit) is exposed, and a deep cavity can be made by etching the cap wafer beyond the original depth of the recess by using the frit material as the etch mask, i.e. removing Si with fluorine-based chemistries that will not attack the frit.

Accordingly, the method(s) of the present invention provide a finer frit linewidth than what than what is presently available, in order to limit the effects of capacitive parasitics, and in order to provide a device requiring smaller die such that more can be made on a wafer, and to provide a way of determining a capping cavity depth independent of frit material thickness.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A method of packaging electronic devices operating based on acoustic waves, comprising the steps of:

providing a cap wafer having a surface;

trenching recesses into the cap wafer surface at areas near the perimeter of a desired cavity region;

printing material into the recesses and planarizing it such that each filled recess is flush with the cap wafer surface; and etching away the cap wafer surface, except for the areas of the original recesses, so that the material forms raised ridges to be bonded to a substrate surface in contact with at least one electronic device.

2. The method of claim 1, wherein each of the raised ridges is formed slightly inboard from the perimeter of a desired cavity region, each raised ridge composed of a glass frit material for bonding the cap wafer to the substrate surface.

3. The method of claim 2, wherein a linewidth of the frit is less than 125 μm.

4. The method of claim 1, wherein, after the recesses are formed and the recesses are filled, the raised ridges are fabricated by etching the surrounding cap wafer surface surrounding each filled recess.

5. The method of claim 1 wherein the raised ridges form a continuous perimeter around a cavity region such that a hermetic seal is made when the cap wafer is bonded to a wafer or a substrate in contact with an electronic device.

* * * * *